(12) United States Patent
Smith et al.

(10) Patent No.: US 10,913,869 B2
(45) Date of Patent: Feb. 9, 2021

(54) COATING FOR THE MITIGATION OF METAL WHISKERS

(71) Applicant: Raytheon Company, Waltham, MA (US)

(72) Inventors: David R. Smith, Tucson, AZ (US); Thomas M. Deppert, Gilbert, AZ (US); William C. Mollberg, Marana, AZ (US); Frank A. Wolf, Tucson, AZ (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 16/185,863

(22) Filed: Nov. 9, 2018

(65) Prior Publication Data

US 2019/0077976 A1 Mar. 14, 2019

Related U.S. Application Data

(63) Continuation of application No. 15/175,303, filed on Jun. 7, 2016, now Pat. No. 10,184,054.

(51) Int. Cl.
| | | |
|---|---|---|
| *C09D 7/63* | (2018.01) |
| *H05K 3/28* | (2006.01) |
| *C09D 133/02* | (2006.01) |
| *C09D 163/00* | (2006.01) |
| *C09D 165/04* | (2006.01) |

(Continued)

(52) U.S. Cl.
CPC ............ *C09D 7/63* (2018.01); *C09D 133/02* (2013.01); *C09D 163/00* (2013.01); *C09D 165/04* (2013.01); *C09D 175/04* (2013.01); *C09D 183/04* (2013.01); *C23C 26/00* (2013.01); *H05K 3/285* (2013.01); *C08K 5/29* (2013.01); *H05K 2201/0769* (2013.01); *H05K 2201/09872* (2013.01); *H05K 2203/121* (2013.01)

(58) Field of Classification Search
CPC .......... C08K 3/105; C08K 3/11; C08K 5/092; C08K 5/29; H05K 2201/0769; H05K 3/285; C07F 1/10; C07F 7/2284; C09D 7/63; C09D 175/04
See application file for complete search history.

(56) References Cited

U.S. PATENT DOCUMENTS

| | | | | |
|---|---|---|---|---|
| 6,110,349 A | * | 8/2000 | Kawamura | ............ C25D 21/18 205/611 |
| 6,248,455 B1 | * | 6/2001 | Adams | .................... B32B 15/08 428/626 |

(Continued)

FOREIGN PATENT DOCUMENTS

| | | | |
|---|---|---|---|
| JP | 2010229535 A | * | 10/2010 |
| WO | 2009110902 A1 | | 9/2009 |

OTHER PUBLICATIONS

Scifinder Properties of CAS 15680-42-9 (2018).*

(Continued)

*Primary Examiner* — Kregg T Brooks
(74) *Attorney, Agent, or Firm* — Cantor Colburn LLP

(57) ABSTRACT

A coating for mitigating metal whiskers on a metal surface includes a polymeric coating material; and a metal ion complexing agent impregnated within the polymeric coating material, the metal ion complexing agent having a standard reduction potential (E°) that is greater than a metal in the metal surface.

17 Claims, 2 Drawing Sheets

(51) Int. Cl.
*C09D 175/04* (2006.01)
*C09D 183/04* (2006.01)
*C23C 26/00* (2006.01)
*C08K 5/29* (2006.01)

(56) References Cited

U.S. PATENT DOCUMENTS

| | | | |
|---|---|---|---|
| 2002/0040094 A1* | 4/2002 | Takahashi | C08F 283/06 524/590 |
| 2002/0093109 A1 | 7/2002 | Kline | |
| 2005/0020763 A1* | 1/2005 | Milic | C08G 18/6254 524/507 |
| 2008/0075872 A1 | 3/2008 | Lichtenhan et al. | |
| 2008/0216704 A1 | 9/2008 | Eisenbeis et al. | |
| 2012/0195016 A1 | 8/2012 | Landman et al. | |
| 2013/0302381 A1* | 11/2013 | Barnett | A61K 31/436 424/400 |
| 2014/0347787 A1 | 11/2014 | Fathi et al. | |
| 2018/0305557 A1* | 10/2018 | Arpac | C23C 18/1241 |

OTHER PUBLICATIONS

Scifinder Properties of CAS 147-14-8 (2019).*
H.M. Cobb, ed. Dictionary of Metals (2012).*
Partial machine translation of JP-2010229535-A (2020).*
Bruckner, Christian; "The Silver Complexes of Porphyrins, Corroles, and Carbaporhyrins: Silver in the Oxidation States II and III"; Journal of Chemical Education; vol. 81, No. 11; p. 1665-1669; Nov. 2004.
Brusse, Jay, et al.; "Metal Whiskers: A Discussion of Risks and Mitigation"; Symposium on Part Reprocessing, Tin Whisker Mitigation and Assembly Rework; p. 1-45; Nov. 12, 2008.

International Search Report and Written Opinion for International Patent Application PCT/US2017/034435; International Filing Date: May 25, 2017; Priority date Jun. 7, 2016; 7 pages.
Laverny, Patrick; "Strategies to Mitigate the Tin Whisker Phenomenon"; Vicor Corp.; Rev. 1.1; p. 1-4; Feb. 2006.
O'Boyle, John; "Tin Whiskers Are Real and Complex"; Maxim Integrated; p. 1-7; Dec. 13, 2011.
Osterman, M.; "Mitigation Strategies for Tin Whiskers"; CALCE; p. 1-11; Aug. 28, 2002.
Paiva, Isabela L., et al.; "Silver (I) Complexes with Symmetrical Schiff Bases: Synthesis, Structural Characterization, DFT Studies and Antimycobacterial Assays"; Polyhedron; vol. 62; p. 104-109; 2013.
Panashchenko, L., et al.; "Long Term Investigation or Urethane Conformal Coating Against Tin Whisker Growth"; IPC Tin Whisker Conference; p. 1-31; Dec. 2010.
Rao, V. Koteswara, et al.; "Synthesis of Schiff's Bases in Aqueous Medium: A Green Alternative Approach with Effective Mass Yield and High Reaction Rates"; Green Chemistry Letters and Reviews; vol. 3, No. 3; p. 217-223; Sep. 2010.
Savalia, RV, et al.; "Rapid and Economic Synthesis of Schiff Base of Salicylaldehyde by Microwave Irradiation"; Research Journal of Chemical Sciences; vo. 3, No. 10; p. 97-99; Oct. 2013.
SBI-STTR; "POSS-Based Conformal Coating with Active Tin Whisker Mitigation Properties"; published on SBIR.gov(https://www.sbir.gov); p. 1-2; 2008.
Tallon, Theresa M.; "Synthesis of Imidazole Schiff Base Ligands,Their Silver(I) Complexes and Their Activities Against Candida Albicans"; A Thesis Submitted to the National University of Ireland; p. 1-308; 2010.
Woodrow, Thomas A., et al.; "Evaluation of Conformal Coatings as a Tin Whisker Mitigation Strategy"; IPC/JEDEC 8th International Conference on Lead-Free Electronic Components and Assemblies; p. 1-25; Apr. 18-20, 2005.
Zapanta, Loren R.; "Tin Whisker White Paper"; JESD201 Approach; Cypress Perform; p. 1-30; Sep. 2012.

* cited by examiner

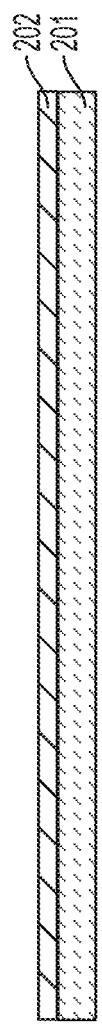
FIG. 2A
FIG. 2B

COATING FOR THE MITIGATION OF METAL WHISKERS

CROSS-REFERENCE TO RELATED APPLICATION

This application is a continuation of and claims benefit of U.S. patent application Ser. No. 15/175,303, filed Jun. 7, 2016, the entire contents of which are incorporated herein in their entirety.

BACKGROUND

The present disclosure relates to metal-containing surfaces, and more particularly, to methods to mitigate formation of tin whiskers on tin-containing surfaces.

Pure tin (Sn) plating has replaced tin-lead alloy solders in many electrical applications, for example, electrical hardware, circuit board traces, component leads, and ground planes. Replacing tin-lead alloy solders with pure tin plating is driven, in part, by environmental and health concerns about lead.

The "whisker" or "tin whisker" phenomenon is a failure mode associated with some electronic devices that use a number of low melting point elements (e.g., tin (Sn), cadmium (Cd), zinc (Zn), nickel (Ni), and indium (In)) in operations such as soldering. As shown in FIG. 1, tin whiskers 101 may be formed from a pure (or substantially pure) tin-based surface 100. Whiskers may also form on other surfaces, such as nickel surfaces. Generally, metal whiskers have a small mass (for example, less than 100 micrograms) with a high surface area-to-volume ratio. Because metal whiskers are conductive and can carry high current, they may result in electronic shorting failures.

SUMMARY

According to one embodiment, a coating for mitigating metal whiskers on a metal surface includes a polymeric coating material; and a metal ion complexing agent impregnated within the polymeric coating material, the metal ion complexing agent having a standard reduction potential (E°) that is greater than a metal in the metal surface.

According to another embodiment, a coating for mitigating tin whiskers on a tin surface includes a polymeric coating material including silver nanoparticles and a complex of a tin ion and a Schiff base-containing compound; wherein the coating is disposed on a tin surface comprising about 97 to about 100 atomic % (at. %) tin.

Yet, according to another embodiment, a method for mitigating tin whiskers includes providing a substrate having a tin surface including about 97 to about 100 atomic % (at. %) tin; forming a polymeric coating including a complexing agent that can chelate tin; and disposing the polymeric coating on the tin surface, the complexing agent reacting with tin in a tin whisker to form a tin ion:complexing agent complex.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

For a more complete understanding of this disclosure, reference is now made to the following brief description, taken in connection with the accompanying drawings and detailed description, wherein like reference numerals represent like parts:

FIG. 2A is a cross-sectional side view of a metal layer arranged on a substrate; and FIG. 2B is a cross-sectional side view of a coating arranged on the metal layer of FIG. 2A according to embodiments.

DETAILED DESCRIPTION

Figure 1:
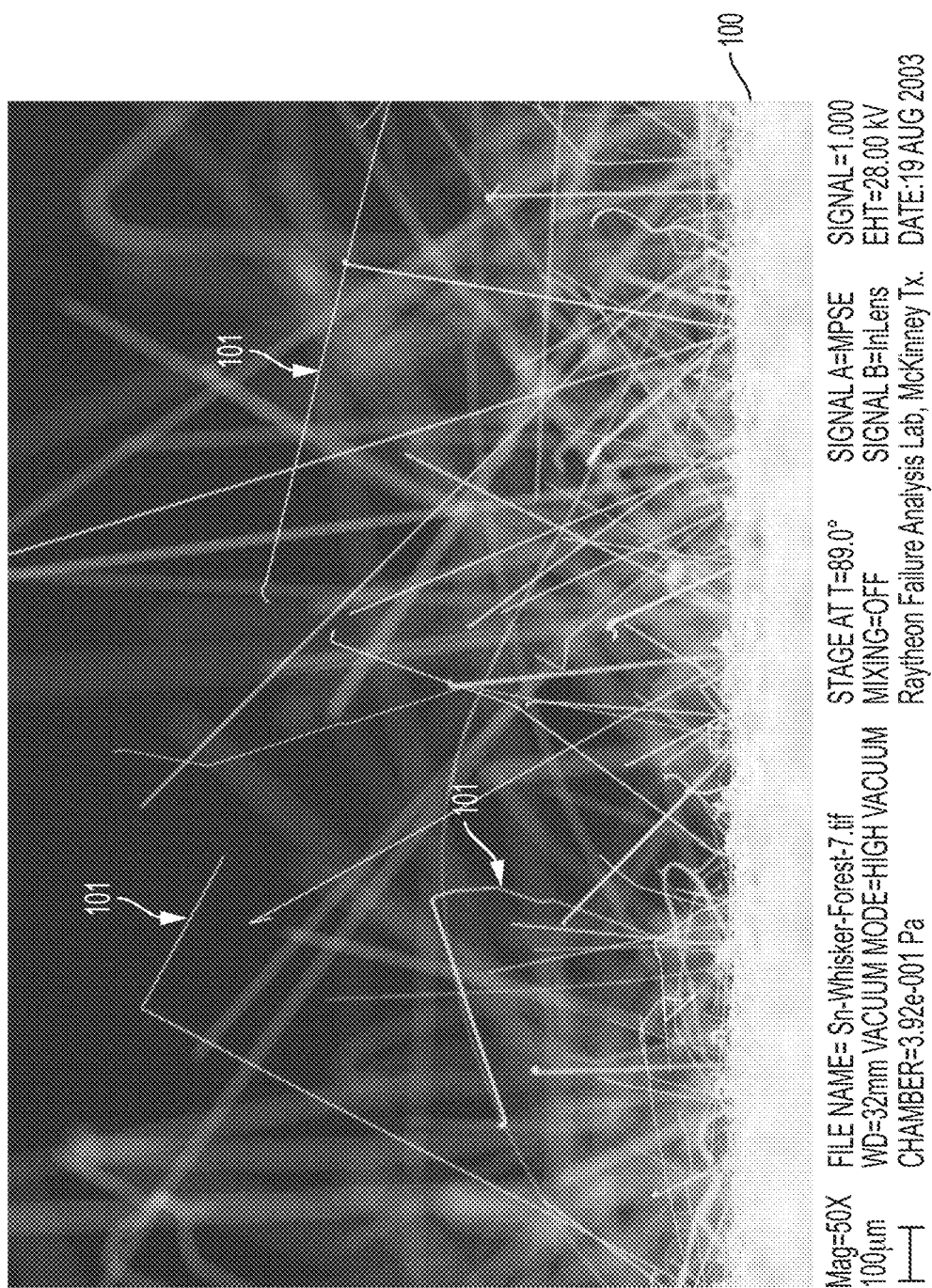
FIG. 1 is an scanning electron micrograph (SEM) of tin whiskers formed on a tin surface.

Various approaches are used to reduce or eliminate formation of metal whiskers (e.g., tin whiskers) in electronic devices that include metal surfaces (e.g., tin surfaces or nickel surfaces). On tin surfaces, one approach includes contaminating tin with another metal to prevent tin whisker formation. However, such contamination generally uses environmentally unfriendly metals. Another approach to mitigating tin whiskers includes applying a conformal coating to tin surfaces. However, tin whiskers can still grow through conformal coatings.

Accordingly, as described herein, various embodiments provide a conformal coating with an additive that complexes, or in some embodiments, chelates, metal ions in metal whiskers (e.g., tin whiskers) as they grow or extend from a metal surface. The metal in the whiskers is consumed to substantially eliminates/mitigate the whiskers. In embodiments, the additive is a metal oxidizer that is incorporated into the coating and reacts with the metal in the surface to consume or eliminate the tin whisker. In one exemplary embodiment, the additive is an oxidizing complex that includes a metal ion:Schiff base complex, and tin in the tin whisker replaces the metal to produce silver nanoparticles that are suspended in the coating. The silver ion functions as the oxidizer to oxidize a tin ion, and the Schiff base complexes the silver ion, which is replaced by the tin ion.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As used herein, the terms "Schiff base" means a compound with a functional group having a carbon-nitrogen double bond with the nitrogen atom connected to an aryl or alkyl group. The bases described herein have the following formula: $R_1R_2C=NR_3$, wherein $R_1$ is a hydrogen or an organic side chain, and $R_2$ and $R_3$ are each organic side chains.

Turning again to the Figures, FIG. 2A is a cross-sectional side view of a metal layer 202 arranged on a substrate 201. The substrate 201 may be any surface, for example, a laminate, such as an interposer, printed circuit board, or other device. The laminate surface may include, for example, silicon, ceramic, glass, polymers, copper, or any combination thereof. The substrate 201 may also a chip, such as, a board, a die, or a wafer.

The metal layer 202 is arranged on the substrate 201. Although not shown in FIG. 2A, any number or types of layers or other coatings may be present between the metal layer 202 and the substrate 201. For example, dielectric layers may be arranged on the substrate 201. The metal layer 202 may be a tin coating, interconnect structure, solder bump, tin plated surface, or other tin-containing surface. The thickness and dimensions of the metal layer 202 shown in FIG. 2A is not drawn to scale and is for illustrative purposes only. Further, the metal layer 202 may only cover a portion of the substrate 201 and does not have to substantially cover a surface of the substrate 201.

The metal layer 202 includes a metal. In one example, the metal is tin. The tin may be pure or substantially pure. In one embodiment, the metal layer 202 includes about 100 atomic % (at. %) tin. In other embodiments, the metal layer 202 includes tin and one or more additives to form a tin alloy. In some embodiments, the metal layer 202 may include about 97 at. % to about 100 at. % tin. In other embodiments, the metal layer 202 may include about 98 at. % to about 99 at. % tin. Tin alloys may include tin and another metal, for example, silver, copper, nickel, lead, palladium, gold, or a combination thereof. In another example, the metal of the metal layer 202 is nickel. Yet, in another example, the metal of the metal layer 202 is cadmium, zinc, or indium. As mentioned above, the thickness of the metal layer 202 may generally vary and is not intended to be limited.

FIG. 2B is a cross-sectional side view of a coating 203 arranged on the metal layer 202 of FIG. 2A according to embodiments. The coating 203 is a conformal coating layer that incorporates at least one oxidizing additive. The oxidizing additive is impregnated within a polymeric coating material. The coating 203 includes any polymeric conformal coating material. Non-limiting examples of polymeric materials include urethanes, acrylics, urethane acrylics, silicones, epoxies, parylenes, or any combination thereof.

The metal complexing additive (e.g., a tin complexing additive) is added to the polymeric material of the conformal coating before depositing on the metal surface. The metal complexing additive thus modifies the coating. After deposition on the metal layer 202, any metal whiskers (e.g., tin whiskers) formed from the metal layer 202 that grow into the coating 203 are oxidized, consuming the metal whisker. The metal whiskers thus prevented from growing from the metal surface.

The complexing additive may be any complexing agent, oxidizing agent, oxidizing compound, or oxidizing complex that reacts with and complexes metal in the metal surface to mitigate whisker formation. In one embodiment, the complexing additive is an oxidizing complex that includes an oxidizing metal ion and a Schiff base-containing compound. The oxidizing metal ion depends on the metal that is to be displaced in the metal surface. When the metal surface includes tin and tin whiskers are the concern, the metal ion functions as the oxidizer and has a standard reduction potential (E°) that is greater than tin ($Sn^{2+}+2e^-\rightarrow Sn$). Tin has a standard reduction potential of about −0.14 volts. After reacting with the complexing additive, the tin in the tin whiskers is in the form of a tin ion, or $Sn^{2+}$. When the metal surface includes nickel and nickel whiskers are the concern, the metal ion has a E° that is greater than nickel ($Ti^{2+}+2e^-\rightarrow Ti$). Nickel has a standard reduction potential of about −0.25 volts. After reacting with the complexing additive, the nickel in the nickel whiskers is in the form of a nickel ion, or $Ni^{2+}$.

The Schiff base containing compound chelates or complexes the metal ion. In one embodiment, the oxidizing agent in the additive oxidizes the metal whisker according to Reaction Scheme I, after being deposited on a metal surface:

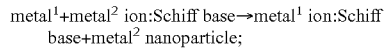

or according to Reaction Scheme II:

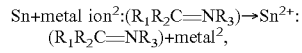

wherein $R_1$ is a hydrogen or an organic side chain, and $R_2$ and $R_3$ are each independently organic side chains, which may be the same or different. The organic side chain may be a substituted or unsubstituted alkyl group, a substituted or unsubstituted alkenyl group, a substituted or unsubstituted alkynyl group, a substituted or unsubstituted aryl group, a substituted or unsubstituted cycloalkyl group, or a combination thereof. The substitutions can include any functional group, including, but not limited to, an acrylate group, an acyl halide group, an amide group, an amine group, a carboxylate group, a carboxylate thiol group, an epoxy group, an ester group, an ether group, a halogen, a hydroxamic acid group, a hydroxyl group, a nitrate group, a nitrile group, a phosphate group, a phosphine group, a phosphonic acid group, a silane group, a sulfate group, a sulfide group, a sulfite group, a thiolate group, an azide group, an acetal group, an aldehyde group, a diene group, an imine group, or any combinations thereof.

When the substituted functional group in Reaction Scheme II is an imine group, the imine group can be another Schiff base functional group, such that two Schiff base complexes are present in the compound.

The metal[1] in Reaction Scheme I can be any metal present in a metal surface, for example, tin or nickel. The metal[2] in Reaction Schemes I and II can be any metal that can form a complex with the Schiff base when in an ionized form and be substituted for tin ions, or other metal derived from a metal surface. As mentioned above, the metal ion in the complex can be any metal with a standard reduction potential that is greater than the metal, for example, greater than about −0.14 volts (the standard reduction potential of tin). Non-limiting examples of suitable metals for the complexing agent include silver, gold, platinum, palladium, copper, cerium, rhodium, or a combination thereof. Exemplary standard reduction potentials are shown below in Table 1. The metals may be present in any oxidation state, which depends on a variety of factors. In one non-limiting example, silver ions may be present as $Ag^+$ ions or $Ag^{3+}$ ions.

TABLE 1

| Half reaction | E°/V |
|---|---|
| $Zn^{2+} + 2e^- \rightarrow Zn$ | −0.76 |
| $In^{3+} + 3e^- \rightarrow In$ | −0.40 |
| $Cd^{2+} + 2e^- \rightarrow Cd$ | −0.40 |
| $Ni^{2+} + 2e^- \rightarrow Ni$ | −0.25 |
| $Sn^{2+} + 2e^- \rightarrow Sn$ | −0.14 |
| $Ag^+ + e^- \rightarrow Ag$ | +0.80 |
| $Rh^{3+} + 3e^- \rightarrow Rh$ | +0.80 |
| $Pd^{2+} + 2e^- \rightarrow Pd$ | +0.99 |
| $Pt^{2+} + 2e^- \rightarrow Pt$ | +1.19 |
| $Au^{3+} + 3e^- \rightarrow Au$ | +1.50 |
| $Ce^{4+} + 2e^- \rightarrow Ce^{3+}$ | +1.61 |

In Reaction Schemes I and II, the metal ion[2]:Schiff base complex is the oxidizing complex. Upon deposition on the tin surface, metal surface, for example, tin ions in any tin whiskers extending from the tin surface displaces the metal in the metal ion:Schiff base complex. Metal particles (i.e., nanoparticles) are produced as a by-product of the reaction. Thus, the tin whiskers are consumed and mitigated.

In Reaction Schemes I and II, the molar ratios of the metal ion$^2$ to Schiff base ($R_1R_2C\!\!=\!\!NR_3$) are not limited to a 1:1 ratio. For example, the molar ratio of metal ion$^2$ to Schiff base ($R_1R_2C\!\!=\!\!NR_3$) may be 1:1, 1:2, or 2:2.

In another embodiment, the oxidizing complex is a complex of a Schiff base and silver ion (silver:Schiff base). The molar ratios of the silver ion to Schiff base may be, for example, 1:1 silver to Schiff base or 1:2 silver to Schiff base. The silver may be in the form of silver (I) ions or silver (III) ions. The reaction of the silver:Schiff base complex with the tin whiskers occurs may occur according to Reaction Scheme III:

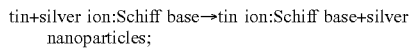

or according to Reaction Scheme IV:

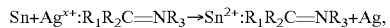

wherein $R_1$ is a hydrogen or an organic side chain, $R_2$ and $R_3$ are each independently organic side chains, which may be the same or different, and x is 1 or 3. The organic side chain may be a substituted or unsubstituted alkyl group, a substituted or unsubstituted alkenyl group, a substituted or unsubstituted alkynyl group, a substituted or unsubstituted aryl group, a substituted or unsubstituted cycloalkyl group, or a combination thereof. The substitutions can include any functional group, including, but not limited to, an acrylate group, an acyl halide group, an amide group, an amine group, a carboxylate group, a carboxylate thiol group, an epoxy group, an ester group, an ether group, a halogen, a hydroxamic acid group, a hydroxyl group, a nitrate group, a nitrile group, a phosphate group, a phosphine group, a phosphonic acid group, a silane group, a sulfate group, a sulfide group, a sulfite group, a thiolate group, an azide group, an acetal group, an aldehyde group, a diene group, an imine group, or any combination thereof.

In Reaction Schemes III and IV, the silver ion ($Ag^{x+}$): Schiff base complex is the oxidizing agent. Tin ions replace silver ions in the silver ($Ag^{x+}$):Schiff base. Silver nanoparticles are produced as a by-product of the reaction. Thus, the tin whiskers are consumed and mitigated.

The oxidizing complex may include a symmetric Schiff base compound that includes at least two Schiff base functional groups. The symmetric Schiff bases chelates or complexes the silver ions in a 1:1 molar ratio or 1:2 molar ratio of silver to Schiff base compound.

In an exemplary embodiment, the oxidizing complex is a metal ion, such as a silver ion, complexed with N,N'-bis[(4-methoxyphenyl)methylidene]ethane-1,2-diamine (MBDA) (silver:MBDA). The MBDA has the following structure (structure I):

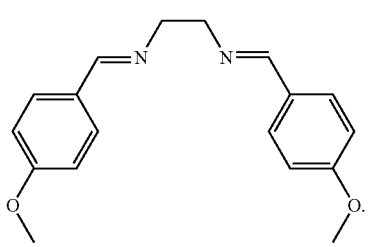 [SMILES: COc1ccc(/C=N/CC/N=C/c2ccc(OC)cc2)cc1]

The silver ion:MBDA complex may include additional anions, such as nitrates ($NO_3$). The molar ratio of silver ions to MBDA in the silver ion:MBDA can be, for example, 1:1 or 1:2. For example, the complexes can be $Ag(MBDA)_2$ $NO_3$, $Ag(MBDA)_2$, or AgMBDA.

In another embodiment, the oxidizing complex is a metal ion, such as a silver ion, complexed with N,N'-bis[(4-methoxyphenyl)methylidene]propane-1,3-diamine (MBDB) (silver:MDBB). The MBDB has the following structure (structure II):

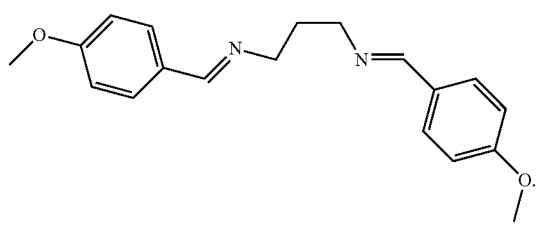 [SMILES: COc1ccc(/C=N/CCC/N=C/c2ccc(OC)cc2)cc1]

The silver ion:MBDB complex may include additional anions, such as nitrates ($NO_3$). The molar ratio of silver ions to MBDB in the silver ion:MBDB can be, for example, 1:1 or 1:2. For example, the complexes can be $Ag(MBDB)_2$ $NO_3$, $Ag(MBDB)_2$, or AgMBDB.

Yet, in another embodiment, the oxidizing complex is a silver ion:Schiff base complex. The Schiff base has the following structure (structure III):

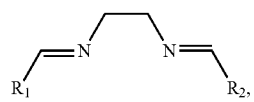

wherein $R_1$ and $R_2$ are each independently a substituted or unsubstituted alkyl group, a substituted or unsubstituted alkenyl group, a substituted or unsubstituted alkynyl group, a substituted or unsubstituted aryl group, a substituted or unsubstituted cycloalkyl group, or a combination thereof. The substitutions can include any functional group, including, but not limited to, an acrylate group, an acyl halide group, an amide group, an amine group, a carboxylate group, a carboxylate thiol group, an epoxy group, an ester group, an ether group, a halogen, a hydroxamic acid group, a hydroxyl group, a nitrate group, a nitrile group, a phosphate group, a phosphine group, a phosphonic acid group, a silane group, a sulfate group, a sulfide group, a sulfite group, a thiolate group, an imine group, or any combination thereof.

In another embodiment, the oxidizing complex is a metal ion:Schiff base complex. The Schiff base has the following structure (structure IV):

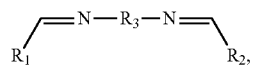

wherein $R_1$, $R_2$, and $R_3$ are each independently a substituted or unsubstituted alkyl group, a substituted or unsubstituted alkenyl group, a substituted or unsubstituted alkynyl group, a substituted or unsubstituted aryl group, a substituted or unsubstituted cycloalkyl group, or a combination thereof. The substitutions can include any functional group, including, but not limited to, an acrylate group, an acyl halide group, an amide group, an amine group, a carboxylate group, a carboxylate thiol group, an epoxy group, an ester group, an ether group, a halogen, a hydroxamic acid group, a hydroxyl group, a nitrate group, a nitrile group, a phosphate group, a phosphine group, a phosphonic acid group, a silane group, a sulfate group, a sulfide group, a sulfite group, a thiolate group, an imine group, or any combination thereof.

In one embodiment, the oxidizing complex is a metal ion:Schiff base complex, and the Schiff base has the following structure (structure V):

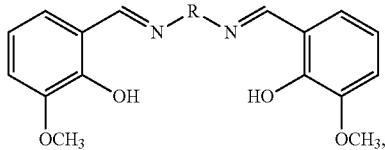

wherein R is a substituted or unsubstituted alkyl group, a substituted or unsubstituted alkenyl group, a substituted or unsubstituted alkynyl group, a substituted or unsubstituted aryl group, a substituted or unsubstituted cycloalkyl group, or a combination thereof. The substitutions can include any functional group, including, but not limited to, an acrylate group, an acyl halide group, an amide group, an amine group, a carboxylate group, a carboxylate thiol group, an epoxy group, an ester group, an ether group, a halogen, a hydroxamic acid group, a hydroxyl group, a nitrate group, a nitrile group, a phosphate group, a phosphine group, a phosphonic acid group, a silane group, a sulfate group, a sulfide group, a sulfite group, a thiolate group, an imine group, or any combination thereof. In one example, the Schiff base has the following structure (structure VI):

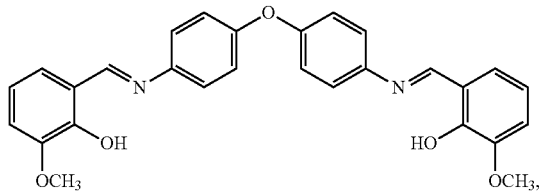 [SMILES: COc1cccc(/C=N/c2ccc(Oc3ccc(/N=C/c4cccc(OC)c4O)cc3)cc2)c1O]

In an embodiment, the oxidizing complex is a metal ion:Schiff base complex, and the Schiff base has the following structure (structure VII):

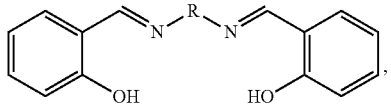

wherein R is a substituted or unsubstituted alkyl group, a substituted or unsubstituted alkenyl group, a substituted or unsubstituted alkynyl group, a substituted or unsubstituted aryl group, a substituted or unsubstituted cycloalkyl group, or a combination thereof. The substitutions can include any functional group, including, but not limited to, an acrylate group, an acyl halide group, an amide group, an amine group, a carboxylate group, a carboxylate thiol group, an epoxy group, an ester group, an ether group, a halogen, a hydroxamic acid group, a hydroxyl group, a nitrate group, a nitrile group, a phosphate group, a phosphine group, a phosphonic acid group, a silane group, a sulfate group, a sulfide group, a sulfite group, a thiolate group, an imine group, or any combination thereof. In one example, the Schiff base is a salen having the following structure (structure VIII):

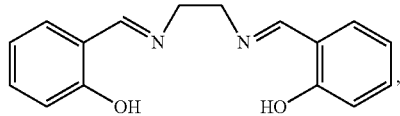 [SMILES: Oc1ccccc1/C=N/CC/N=C/c1ccccc1O]

Other non-limiting examples of Schiff bases include salicylaldoximes (salicylaldehyde oximes), salens (N,N'-Ethylenebis(salicylimine)), and salen-type ligands.

In another embodiment, the oxidizing complex is a metal ion:Schiff base complex, and the Schiff base has the following structure (structure IX):

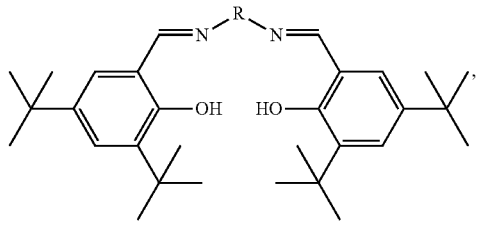

wherein R is a substituted or unsubstituted alkyl group, a substituted or unsubstituted alkenyl group, a substituted or unsubstituted alkynyl group, a substituted or unsubstituted aryl group, a substituted or unsubstituted cycloalkyl group, or a combination thereof. The substitutions can include any functional group, including, but not limited to, an acrylate group, an acyl halide group, an amide group, an amine group, a carboxylate group, a carboxylate thiol group, an epoxy group, an ester group, an ether group, a halogen, a hydroxamic acid group, a hydroxyl group, a nitrate group, a nitrile group, a phosphate group, a phosphine group, a phosphonic acid group, a silane group, a sulfate group, a sulfide group, a sulfite group, a thiolate group, an imine group, or any combination thereof. In one example, the Schiff base is derived from a salen and has the following structure (structure X):

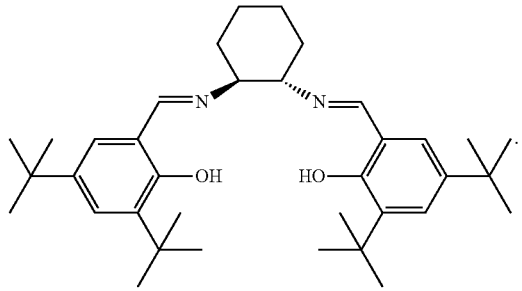 [SMILES: CC(C)(C)c1cc(/C=N/[C@H]2CCCC[C@@H]2/N=C/c2cc(C(C)(C)C)cc(C(C)(C)C)c2O)c(O)c(C(C)(C)C)c1]

In another exemplary embodiment, the oxidizing complex is a metal ion:Schiff base complex having the following structure (structure XI):

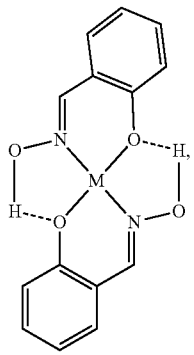

wherein M is a metal ion selected from silver, gold, platinum, palladium, copper, cerium, or rhodium. The metal ion may be in any oxidation state.

The above-described metal ion:Schiff base complexes, and silver ion:Schiff base complexes may be synthesized using known methods. The Schiff bases compounds are initially synthesized using known methods. Then the metal complexes may be formed by adding a metal salt solution to the Schiff base compound. The metal salt solution can be, for example, silver nitrate, when silver is used as the metal ion. Because metal salt solutions are used to form the complexes, additional anions may be included in the resulting complexes after reacting with the metal whiskers. Examples of anions that may also be present in the complexes include acetates, carbonates, chlorides, citrates, cyanides, fluorides, nitrates, nitrites, oxides, phosphates, sulfates, or any combination thereof. In the coating described above with the metal ion:Schiff base complex additives, the Schiff bases are in a deprotonated (basic) form.

The complexing additive in the coating 203 is not limited to the above metal ion:Schiff base complexes and can be any complexing additive that can be suitably incorporated into the coating, provided that the additive reacts with tin to consume the tin in the whiskers. The complexing additive may be a compound or molecule that has a standard reduction potential that is greater than the metal in the metal surface, for example, tin. The complexing agent may also be an oxidizing complex. The reaction may occur according to Reaction Scheme V:

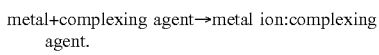

In Reaction Scheme V, the complexing agent reacts with the metal (e.g., tin) in the metal whiskers to form a complex (metal ion:complexing agent), which consumes the metal and eliminates the whiskers beneath and within the coating. Non-limiting examples of suitable complexing agents include molecules and compounds that include porphyrins, substituted porphyrins, corroles, substituted corroles, carbaporphyrins, substituted carbaporphyrins, aminopolycarboxylic acids (i.e., ethylenediametetraacetic acid (EDTA)), phthalocyanines, substituted phthalocyanines, or other like molecules and compounds.

The thickness of the coating 203 may generally vary and is not intended to be limited. One or more layers of the coating 203 may be combined to form a thicker overall coating layer. The thickness of the coating 203 depends on the type of tin layer 202, device, and contents of coating 203 itself. In some embodiments, the coating 203 has a thickness in a range from about 0.1 to about 20 millimeters (mm). In other embodiments, the coating 203 has a thickness in a range from about 1 to about 10 mm.

The coating 203 may be applied to the metal layer 202 using any suitable deposition method known to those skilled in the art, which depends on the type of tin surface, device, and type of coating 203. The coating 203 may be deposited by, for example, spraying or dipping. The coating 203 may be deposited under suitable conditions (i.e., temperature and pressure) which depend on the deposition method.

The above-described coatings may be used on any devices or applications having tin-containing surfaces that may form tin whiskers. Such devices include, but are not limited to, circuit boards, electrical component leads, electronic packaging, or other like devices.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A coating for mitigating metal whiskers on a metal surface, comprising:
   a polymeric coating material arranged on the metal surface, the metal surface being a surface of an electronic component or device; and
   a metal ion complexing agent impregnated within the polymeric coating material, the metal ion complexing agent comprising two Schiff base functional groups that chelate a metal ion, and having a standard reduction potential (E°) that is greater than a metal in the metal surface, such that the metal in the metal surface can be oxidized to displace the metal ion in the metal ion complexing agent;
   wherein the metal ion complexing agent has the following structure:

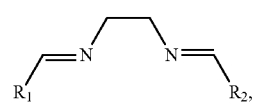

wherein $R_1$ and $R_2$ are each independently a substituted or unsubstituted alkyl group, a substituted or unsubstituted alkenyl group, a substituted or unsubstituted alkynyl group, a substituted or unsubstituted aryl group, a substituted or unsubstituted cycloalkyl group, or a combination thereof; and a substitution on a substituted alkyl group, alkenyl group, alkynyl group, aryl group, or cycloalkyl group is an acrylate group, an acyl halide group, an amide group, an amine group, a carboxylate group, a carboxylate thiol group, an epoxy group, an ester group, an ether group, a halogen, a hydroxamic acid group, a hydroxyl group, a nitrate group, a nitrile group, a phosphate group, a phosphine group, a phosphonic acid group, a silane group, a sulfate group, a sulfide group, a sulfite group, a thiolate group, an azide group, an acetal group, an aldehyde group, a diene group, an imine group, or any combination thereof.

2. The coating of claim 1, wherein tin in a tin whisker can displace the metal ion.

3. The coating of claim 2, wherein the metal ion is a silver ion.

4. The coating of claim 2, wherein the metal ion is a gold ion.

5. The coating of claim 2, wherein the metal ion is a platinum ion.

6. The coating of claim 2, wherein the metal ion is a palladium ion.

7. The coating of claim 2, wherein the metal ion is a copper ion.

8. The coating of claim 2, wherein the metal ion is a cerium ion.

9. The coating of claim 2, wherein the metal ion is a rhodium ion.

10. The coating of claim 1, wherein the metal of the metal surface is tin, and the E° of the metal ion complexing agent is greater than −0.14 volts.

11. The coating of claim 1, wherein the metal of the metal surface is nickel, and the E° of the metal ion complexing agent is greater than −0.25 volts.

12. The coating of claim 1, wherein the coating is disposed on a tin surface comprising about 97 to about 100 atomic % (at. %) tin.

13. The coating of claim 1, wherein the metal ion complexing agent chelates tin.

14. The coating of claim 1, wherein the polymeric coating has a thickness in a range from about 0.1 to about 20 millimeters (mm).

15. The coating of claim 1, wherein the metal surface comprises tin.

16. The coating of claim 1, wherein the metal surface comprises pure or substantially pure tin.

17. A coating for mitigating metal whiskers on a metal surface, comprising:
    a polymeric coating material arranged on the metal surface, the metal surface being a surface of an electronic component or device; and
    a metal ion complexing agent impregnated within the polymeric coating material, the metal ion complexing agent comprising two Schiff base functional groups that chelate a metal ion, and having a standard reduction potential (E°) that is greater than a metal in the metal surface, such that the metal in the metal surface can be oxidized to displace the metal ion in the metal ion complexing agent;
wherein the metal ion complexing agent has the following structure:

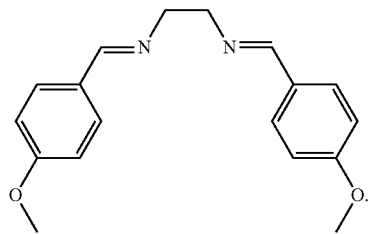 [SMILES: COc1ccc(/C=N/CC/N=C/c2ccc(OC)cc2)cc1]

* * * * *